(12) United States Patent
Choi

(10) Patent No.: US 6,383,849 B1
(45) Date of Patent: May 7, 2002

(54) SEMICONDUCTOR DEVICE AND METHOD FOR FABRICATING THE SAME

(75) Inventor: Jin Hyeok Choi, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/375,359

(22) Filed: Aug. 17, 1999

Related U.S. Application Data

(63) Continuation-in-part of application No. 08/886,155, filed on Jun. 30, 1997, now abandoned.

(30) Foreign Application Priority Data

Jun. 29, 1996 (JP) ................................................. 8-26525

(51) Int. Cl.$^7$ ............................................. H01L 21/336
(52) U.S. Cl. ........................ 438/151; 438/459; 438/977
(58) Field of Search ................................. 438/149, 151, 438/164, 455, 459, FOR 485, 977

(56) References Cited

U.S. PATENT DOCUMENTS

| | | | | |
|---|---|---|---|---|
| 3,689,357 A | * | 9/1972 | Jordan | |
| 5,034,343 A | * | 7/1991 | Rouse et al. | |
| 5,213,986 A | * | 5/1993 | Pinker et al. | |
| 5,231,045 A | * | 7/1993 | Miura et al. | |
| 5,238,865 A | * | 8/1993 | Eguchi | |
| 5,240,883 A | * | 8/1993 | Abe et al. | |
| 5,260,233 A | * | 11/1993 | Buti et al. | |
| 5,278,102 A | * | 1/1994 | Horie | |
| 5,298,449 A | * | 3/1994 | Kikuchi | |
| 5,308,776 A | * | 5/1994 | Gotou | |
| 5,324,678 A | * | 6/1994 | Kusunoki | |
| 5,340,435 A | * | 8/1994 | Ito et al. | |
| 5,344,524 A | * | 9/1994 | Sarma et al. | |
| 5,366,924 A | * | 11/1994 | Easter et al. | |
| 5,468,674 A | * | 11/1995 | Walker et al. | |
| 5,494,849 A | * | 2/1996 | Iyer et al. | |
| 5,569,620 A | * | 10/1996 | Linn et al. | |
| 5,585,304 A | * | 12/1996 | Hayashi et al. | |
| 5,593,915 A | * | 1/1997 | Ohoka | |
| 5,665,631 A | * | 9/1997 | Lee et al. | |
| 5,728,624 A | * | 3/1998 | Linn et al. | |
| 5,773,352 A | * | 6/1998 | Hamajima | |
| 5,773,354 A | * | 6/1998 | Hashimoto | |

FOREIGN PATENT DOCUMENTS

| JP | 56-111258 | * | 9/1981 |
|---|---|---|---|
| JP | 5-206468 | * | 8/1993 |

\* cited by examiner

Primary Examiner—Mary Wilczewski
(74) Attorney, Agent, or Firm—Jacobson Holman, PLLC

(57) ABSTRACT

The present invention relates to the field of the semiconductor fabrication. Also, the objects of the present invention are to provide a semiconductor device and method for fabricating the same having the MOS transistors capable of improving the thermal conduction characteristics and the punch-through and the DIBL effect. To accomplish these objects, the present invention provides the semiconductor device including a semiconductor substrate; a first insulating layer, a selected material layer and a second insulating layer orderly stacked on said semiconductor substrate; and a semiconductor layer formed on the second insulating layer for providing an active area where MOS transistors are formed, wherein, said material layer provides a path for emitting heat generated from said MOS transistors.

7 Claims, 4 Drawing Sheets

SEMICONDUCTOR DEVICE AND METHOD FOR FABRICATING THE SAME

This is a Continuation-In-Part of application Ser. No. 08/886,155 filed Jun. 30 1997, now abandoned.

BACKGROUND OF THE INVENTION

1. Field of the Invention

The present invention relates to a semiconductor device more specifically to a MOS transistor having an SOI (Silicon On Insulator) structure.

2. Description of Related Art

In general, to increase the integration of semiconductor devices, the size of each of the elements in the semiconductor devices must be reduced. In particular, to reduce the size of a MOS transistor, the impurity concentration of the channel region in the MOS transistor must be increased. However, such a high concentration of impurities leads to a higher parasitic capacitance of the MOS transistor. Accordingly, the electric characteristics of the MOS transistor are degraded with reduction of the size of the MOS transistor, so it is required that a low operating voltage is applied to the MOS transistor to maintain the expected life span.

As described above, with the development of highly integrated circuits, there are various problems to be solved. In particular, there are many problems in decreasing electric power consumption and in increase of a operating speed. Also the DIBL(Drain Induced Barrier Lowering) effect which causes the electric field generated from the drain region to have influence upon the source region due to the shortage of the channel length, and the punch-through effect may increase the leakage current of the MOS transistor.

To solve the above problems,an SOI (Silicon On Insulator) structure is proposed as shown in FIG. 1. In this case, an insulating layer 12 which is called a buried oxide layer, is formed on a substrate II and then parasitic capacitance is reduced by the buried oxide layer. Accordingly, the operating speed of circuits are increased. However, it is difficult to transfer downward the heat occurred in the MOS transistors, because the thermal conductivity of silicon oxide layer is 1/100 times as low as silicon layer.

Therefore, it is a primary factor in decreasing the efficiency of the device in with the increase of the heat in the MOS transistor. In addition, the leakage current of the MOS transistor may be greatly increased, because the electric field generated from a drain 14 propagates to the buried oxide layer in the MOS transistor. These characteristics become worse with smaller size of the MOS transistor.

In FIG. 1, reference numeral 11 denotes a silicon wafer, 13 a source, 15 a channel region, 16 a gate oxide layer, 17 a gate electrode.

An ideal structure of the MOS transistor may be implemented, by forming three impurity regions different from one another in the channel beneath the gate oxide layer. That is, a low impurity concentration layer doped, for example, less than $1\times10^{16}$ ions/cm$^3$ is formed up to a predetermined depth, for example, 300 Å from the gate oxide layer to increase mobility of electrons or holes and to increase the driving capacity of the MOS transistor. Subsequently, beneath the low impurity concentration layer, a high impurity concentration layer doped, for example, more than $1\times10^{17}$ ions/cm$^3$ is abruptly formed to reduce the punch-through effect and the DIBL effect from being generated in the MOS transistor and, at a predetermined depth, for example, 1000 Å a low impurity concentration is maintained again to decrease the parasitic capacitance of the source/drain regions. However, it is difficult to embody such a MOS transistor because of the impurity diffusion at a high temperature required in forming an gate oxide layer. That is, although a lay-out for forming such an ideal MOS transistor is provided, the impurities in the higher impurity concentration layer are diffused into the lower impurity concentration layers, at the time of growing the gate oxide layer at a high temperature. As a result, parasitic capacitance is increased by the downward diffused impurities, the current driving capacity is decreased by upward diffused impurities.

SUMMARY OF THE INVENTION

Therefore, an object of the present invention is to provide MOS transistors capable of improving the thermal conduction characteristics and a method for fabricating the same.

Also, another object of the present invention is to provide MOS transistors capable of improving the punch-through and the DIBL effect caused by the electric field generated from the drain regions of the MOS transistors.

In accordance with an aspect of the present invention, there is provided a semiconductor device comprising: a semiconductor substrate; a first insulating layer, a selected material layer and a second insulating layer orderly stacked on said semiconductor substrate; and a semiconductor layer formed on the second insulating layer for providing an active area where MOS transistors are formed, wherein, said material layer provides a path for emitting heat generated from said MOS transistors.

In accordance with another aspect of the present invention, there is provided method of fabricating a semiconductor device comprising the steps of: forming a first insulating layer on a first semiconductor substrate; forming a polysilicon layer on the first insulating layer; forming a second insulating layer on the polysilicon layer; adhering a second semiconductor substrate to the second insulating layer; leaving a part of one of the first and second semiconductor substrate by using chemical mechanical polishing recipe; forming a gate insulating layer and a gate electrode on the whole structure; and forming junctions by using implantation to a selected depth.

BRIEF DESCRIPTION OF THE DRAWINGS

Other objects and aspects of the invention will become apparent from the following description of the embodiments with reference to the accompanying drawings, in which.

DETAILED DESCRIPTION OF THE INVENTION

Hereinafter, the present invention will be described in detail referring to the accompanying drawings.

Figure 1:
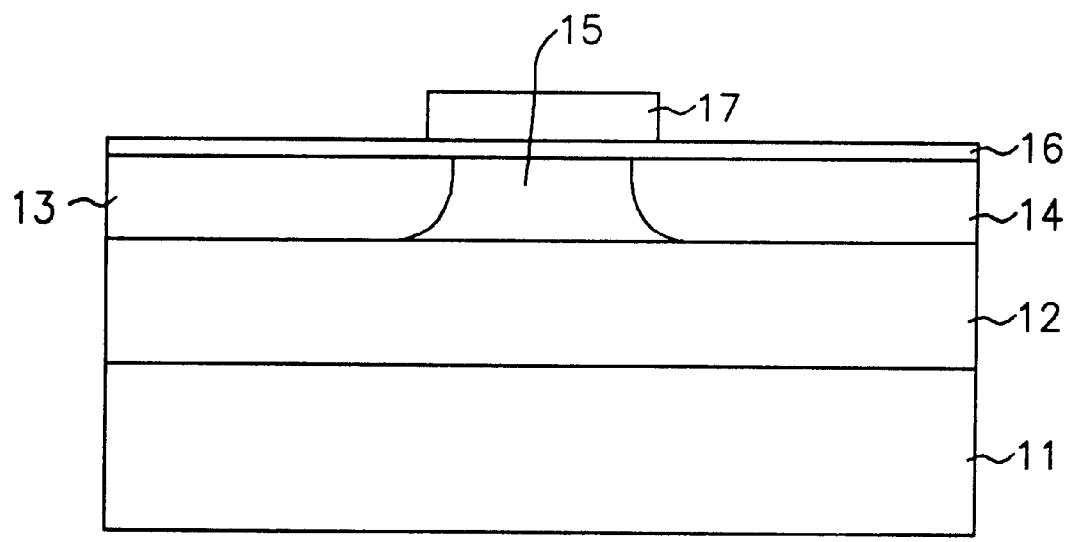
FIG. 1 is a cross-sectional view illustrating a conventional MOS transistor with an SOI structure.
Figure 2A:
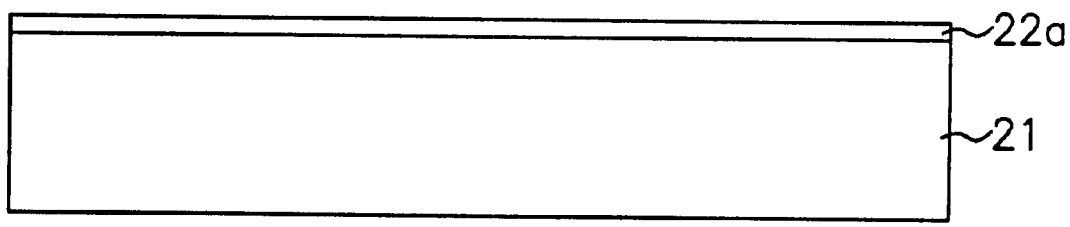
FIGS. 2A–2E is a cross-sectional view illustrating a method for fabricating a MOS transistor in accordance with an embodiment of the present invention.

As shown in FIG. 2A, a thin oxide layer 22a is formed on a silicon wafer 21 to a thickness of 50 Å to 150 Å. At this time, a thermal oxidation or a deposition process may be carried out for forming the oxide layer 22a.

Figure 2B:
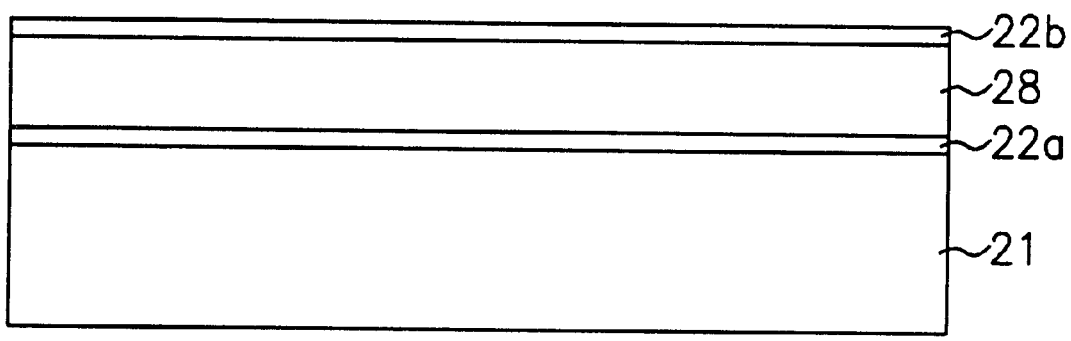

Next, as shown in FIG. 2B, after depositing a polysilicon layer 28 on the oxide layer 22a, an oxide layer 22b is formed on the polysilicon layer 28 to a thickness of 50 Å to 150 Å, by applying the thermal oxidation or the deposition process. The polysilicon layer 28 is much better than a silicon oxide layer in the thermal conductivity.

Figure 2C:
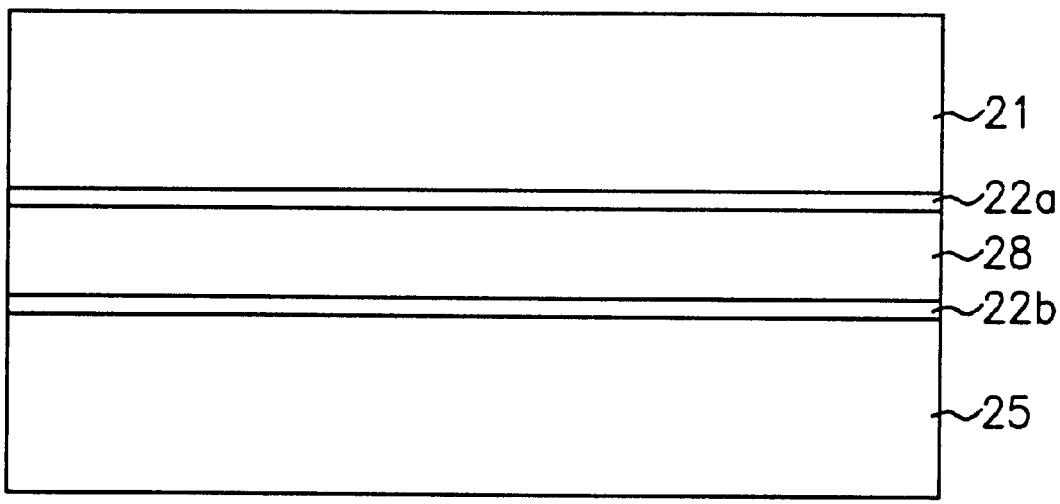

Next, as shown in FIG. 2C, after forming a very thin oxide layer (not shown) to improve adhesion on another silicon wafer 25, the oxide layer 22b which is formed on the polysilicon layer 28 and the silicon wafer 25 are combined.

Figure 2D:
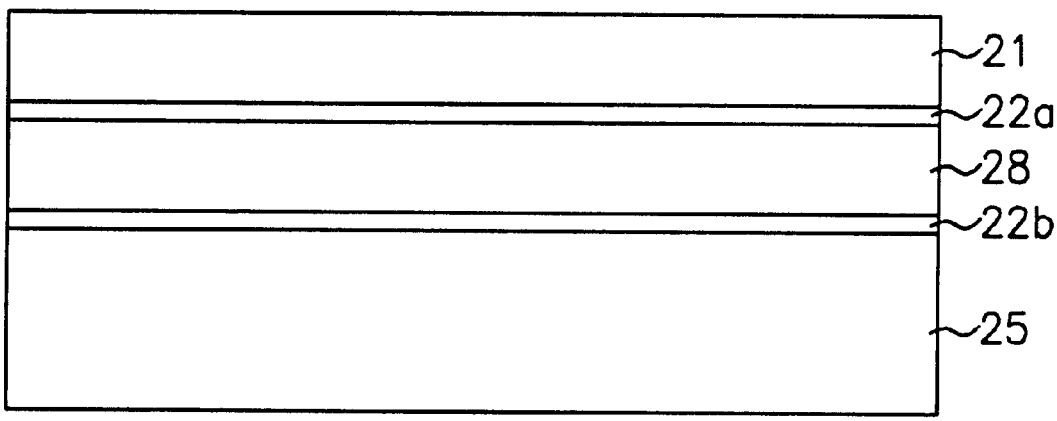

Next, as shown in FIG. 2D, leaving a part of the silicon wafer 21 which is thick enough to form junctions, CMP (Chemical Mechanical Polishing) process is applied to a top portion of the silicon wafer 21.

Figure 2E:
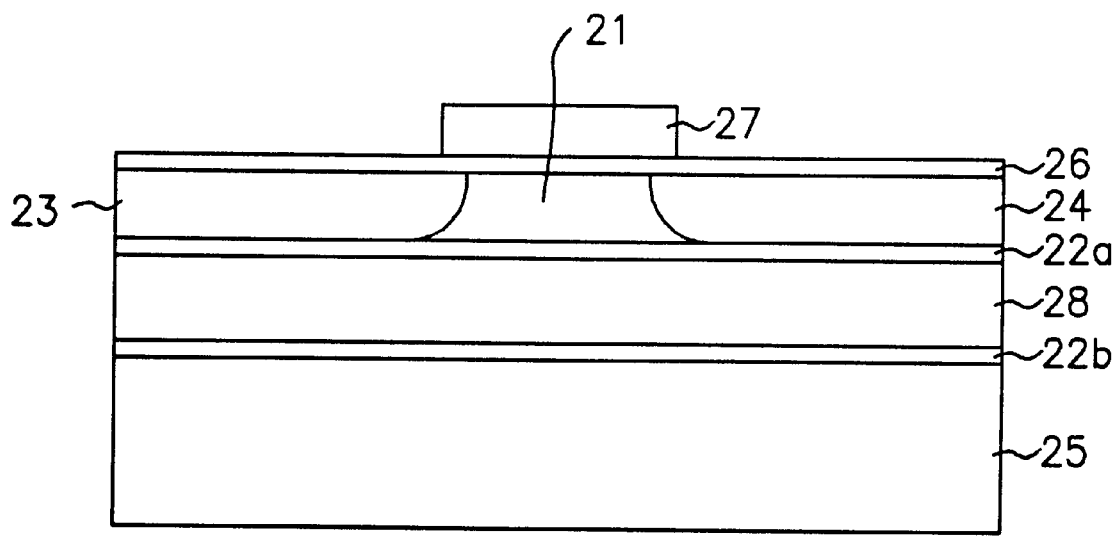

Next, as shown in FIG. 2E, after forming a gate oxide layer 26 and a gate electrode 27 on the resulting structure in due order, a source region 23 and a drain region 24 are formed by the impurity-implantation method.

In an embodiment of the present invention, instead of the buried oxide layer in conventional SOI structure, the polysilicon layer 28 and the oxide layers 22a and 22b are used.

In this structure, the polysilicon layer 28 is doped with an impurity concentration less than $1 \times 10^{16}$ ions/cm$^3$ when an implantation for the control of the threshold voltage of the MOS transistors is carried out.

In this MOS transistor according to the present invention, the multi-layer including the oxide layer 22a, the polysilicon layer 28 and the oxide layer 22b may not only reduce the parasitic capacitance of the source region 23 and drain region 24 as the buried oxide layer of the conventional SOI structure, but also transfer the heat, which is occurred in the MOS transistor, to the silicon wafer 25.

Figure 3:
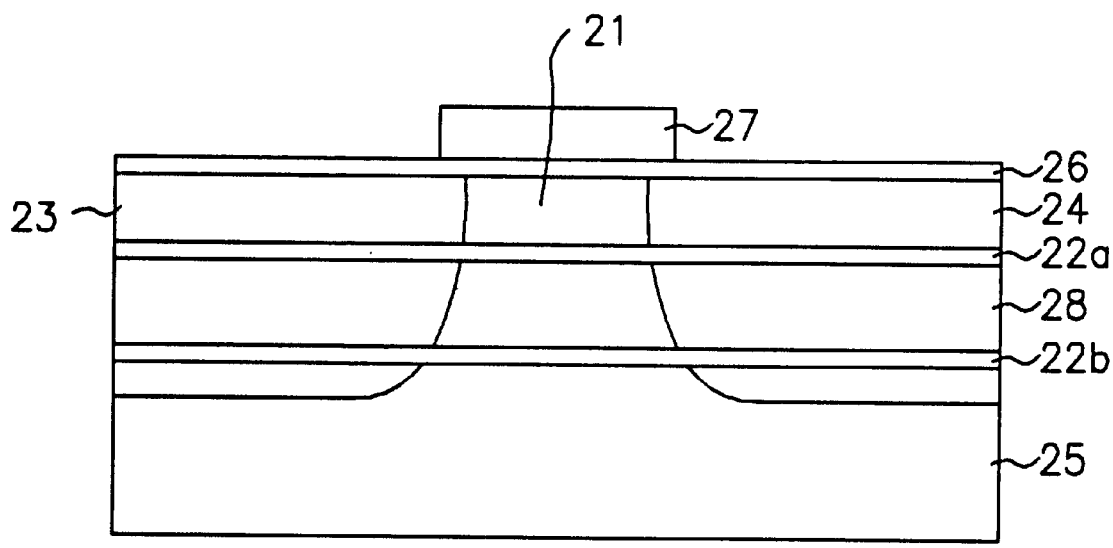
FIG. 3 is a cross-sectional view illustrating a MOS transistor in accordance with another embodiment of the present invention.

FIG. 3 is a cross-sectional view illustrating a MOS transistor in accordance with another embodiment of the present invention which shows the above-mentioned ideal Mos transistor structure. The thickness of the silicon wafer 21 is far thinner than that as shown in FIG. 2E, and its lower layers, the oxide layer 22a, the polysilicon layer 28 and the oxide layer 22b, are also formed to a very thin thickness. At this time, the source region 23 and the drain region Also, the present invention may reduce the parasitic capacitance, by keeping impurity concentration of only the polysilicon layer high. Therefore, the power consumption of the semiconductor device may be reduced and the operating speed of it may be improved.

Although specific embodiments of the present invention are herein described, they are not to be constructed as limiting the scope of the invention. Many embodiments of the present invention will become clear to those skilled in the art in light of the methodology of the specification. The scope of the invention is limited only by the claims appended.

What is claimed is:

1. A method for fabricating a semiconductor device comprising the steps of:

forming a first insulating layer on a first semiconductor substrate;

forming a polysilicon layer on the first insulating layer;

forming a second insulating layer on the polysilicon layer;

adhering a second semiconductor substrate to the second insulating layer;

leaving a part of one of the first and second semiconductor substrate by using chemical mechanical polishing recipe;

forming a gate insulating layer and a gate electrode on the whole structure; and forming source and drain regions by using implantation to a selected depth, wherein an impurity-doped layer is located under the source region and the drain region in said polysilicon layer.

2. A method according to claim 1, further comprising the step of:

forming a thin oxide layer on the second semiconductor substrate to improve the adhesion after the step of forming a second insulating layer.

3. A method according to claim 1, wherein said first and second insulating layers are oxide layers.

4. A method according to claim 1, wherein said first and second insulating layers are oxide-nitride-oxide layers.

5. A method according to claim 1, wherein said polysilicon layer is doped with a impurity concentration of not more than $1 \times 10^{16}$ ions/cm$^3$.

6. A method according to claim 1, wherein said polysilicon layer has a impurity doped area in a lower part of the junctions therein.

7. A method according to claim 6, wherein said impurity doped area has a impurity concentration of at least $1 \times 10^{18}$ ions/cm$^3$.

* * * * *